United States Patent
Masuda et al.

(10) Patent No.: US 11,821,076 B2
(45) Date of Patent: Nov. 21, 2023

(54) SPUTTERING TARGET, MAGNETIC FILM AND METHOD FOR PRODUCING MAGNETIC FILM

(71) Applicant: JX Nippon Mining & Metals Corporation, Tokyo (JP)

(72) Inventors: Manami Masuda, Ibaraki (JP); Masayoshi Shimizu, Ibaraki (JP); Akira Shimojyuku, Ibaraki (JP)

(73) Assignee: JX Metals Corporation, Tokyo (JP)

( * ) Notice: Subject to any disclaimer, the term of this patent is extended or adjusted under 35 U.S.C. 154(b) by 1103 days.

(21) Appl. No.: 16/470,588

(22) PCT Filed: Sep. 11, 2018

(86) PCT No.: PCT/JP2018/033697
§ 371 (c)(1),
(2) Date: Jun. 18, 2019

(87) PCT Pub. No.: WO2020/053972
PCT Pub. Date: Mar. 19, 2020

(65) Prior Publication Data
US 2021/0172055 A1 Jun. 10, 2021

(51) Int. Cl.
*H01J 37/34* (2006.01)
*C23C 14/34* (2006.01)
(Continued)

(52) U.S. Cl.
CPC .......... *C23C 14/3414* (2013.01); *C22C 19/07* (2013.01); *C23C 14/086* (2013.01); *H01J 37/3426* (2013.01)

(58) Field of Classification Search
None
See application file for complete search history.

(56) References Cited

U.S. PATENT DOCUMENTS

| | | | |
|---|---|---|---|
| 2006/0289294 A1* | 12/2006 | Racine | G11B 5/851 204/192.2 |
| 2009/0197757 A1* | 8/2009 | Fukushima | C04B 35/453 501/133 |

(Continued)

FOREIGN PATENT DOCUMENTS

| | | |
|---|---|---|
| EP | 2053028 A1 | 4/2009 |
| JP | 2011-174174 A | 9/2011 |

(Continued)

OTHER PUBLICATIONS

Office Action in TW Application No. 107131886 dated Jun. 28, 2019, 4 pages.

(Continued)

*Primary Examiner* — Jason Berman
(74) *Attorney, Agent, or Firm* — MARSHALL, GERSTEIN & BORUN LLP

(57) ABSTRACT

Provided is a sputtering target that can form a magnetic film having both good magnetic separation between magnetic grains and high coercive force at the same time; a magnetic film; and a method for producing a magnetic film.

The sputtering target according to the present invention comprises: 1 at. % or more of Zn, a part or all of Zn forming a complex oxide(s) of Zn—Ti—O and/or Zn—Si—O; and 45 at. % or less of Pt, the balance being Co and inevitable impurities, the atomic percentage being based on an atomic ratio.

10 Claims, 9 Drawing Sheets

(51) Int. Cl.
    *C22C 19/07*     (2006.01)
    *C23C 14/08*     (2006.01)

(56) References Cited

U.S. PATENT DOCUMENTS

| | | |
|---|---|---|
| 2013/0134038 A1 | 5/2013 | Sato et al. |
| 2013/0213802 A1 | 8/2013 | Sato et al. |
| 2013/0220804 A1 | 8/2013 | Arakawa et al. |
| 2016/0276143 A1 | 9/2016 | Goto et al. |

FOREIGN PATENT DOCUMENTS

| | | |
|---|---|---|
| JP | 2011-175725 A | 9/2011 |
| JP | 2011-208169 A | 10/2011 |
| JP | 4885333 B1 | 2/2012 |
| JP | 2012-117147 A | 6/2012 |
| JP | 2013-224259 A | 10/2013 |
| TW | I306478 B | 2/2009 |
| WO | WO-2012/077665 A1 | 6/2012 |
| WO | WO-2012/086388 A1 | 6/2012 |
| WO | WO-2015/064761 A1 | 5/2015 |
| WO | WO-2017/085933 A1 | 5/2017 |

OTHER PUBLICATIONS

International Preliminary Report on Patentability and Written Opinion in International Application No. PCT/JP2018/033697 dated Mar. 25, 2021, 6 pages.
Search Report in International Application No. PCT/JP2018/033697 dated Nov. 27, 2018, 2 pages.

\* cited by examiner

[FIG. 1]
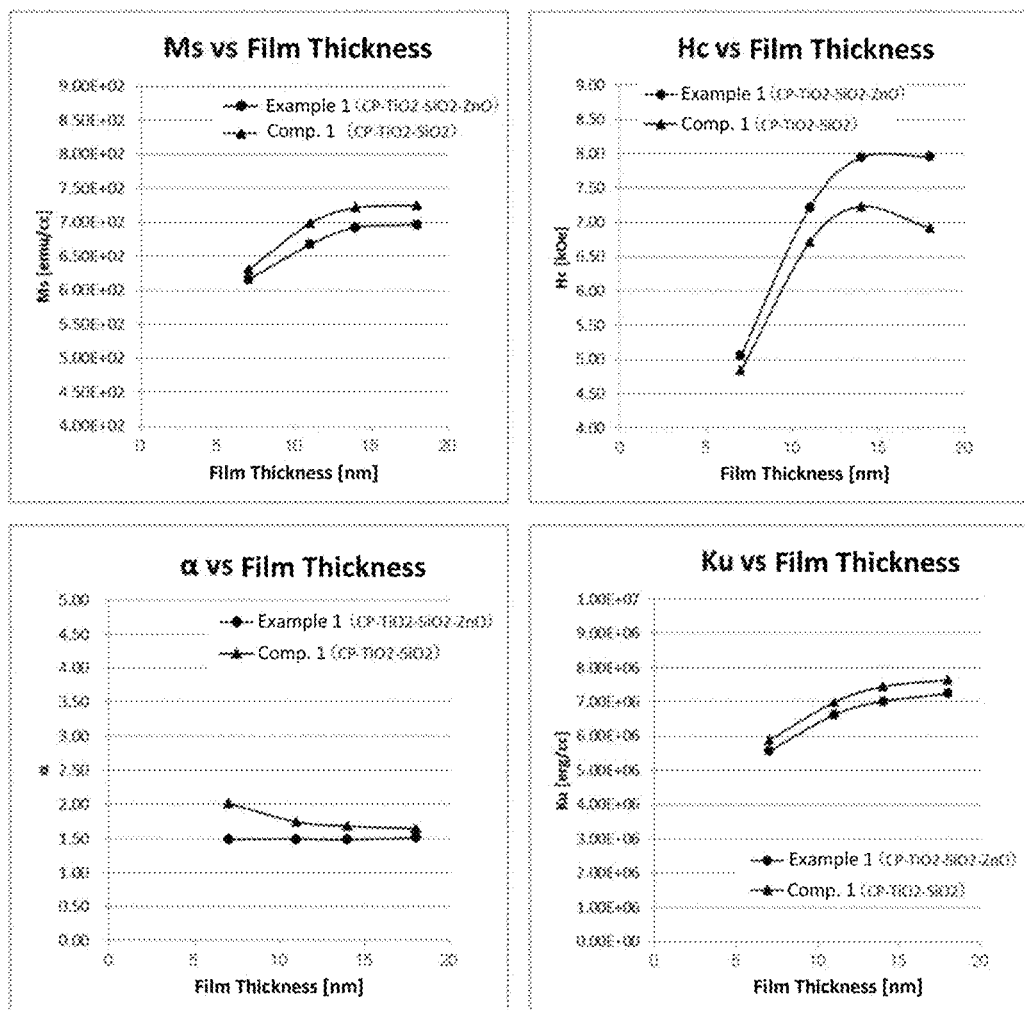

[FIG. 2]
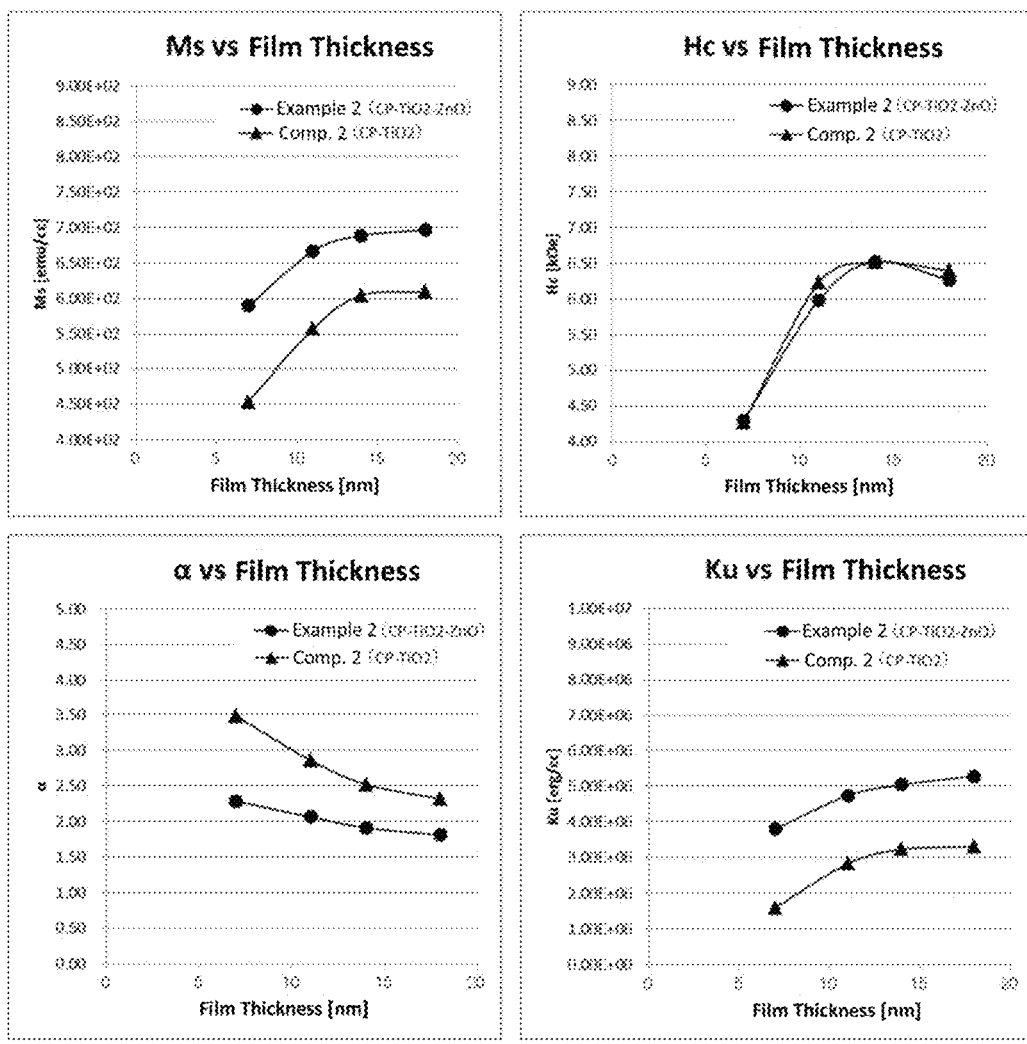

[FIG. 3]
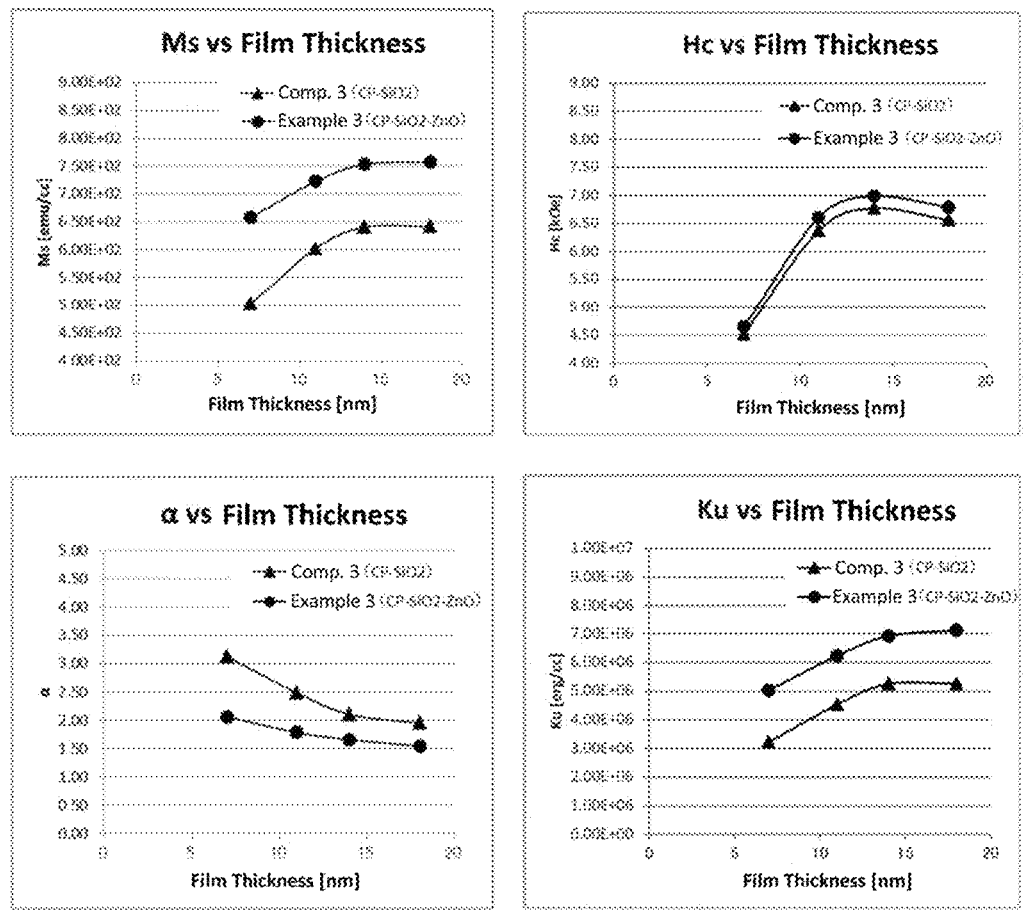

[FIG. 4]
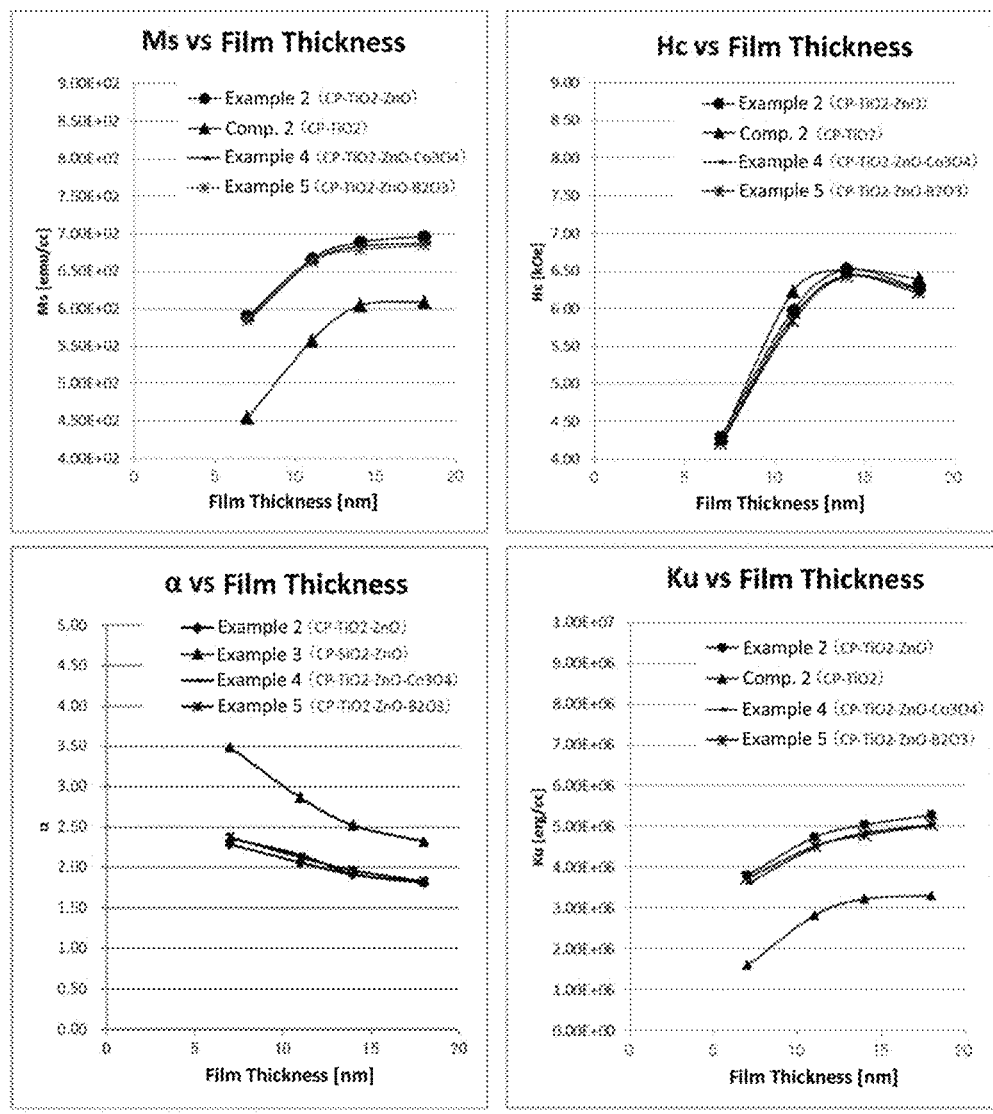

[FIG. 5]
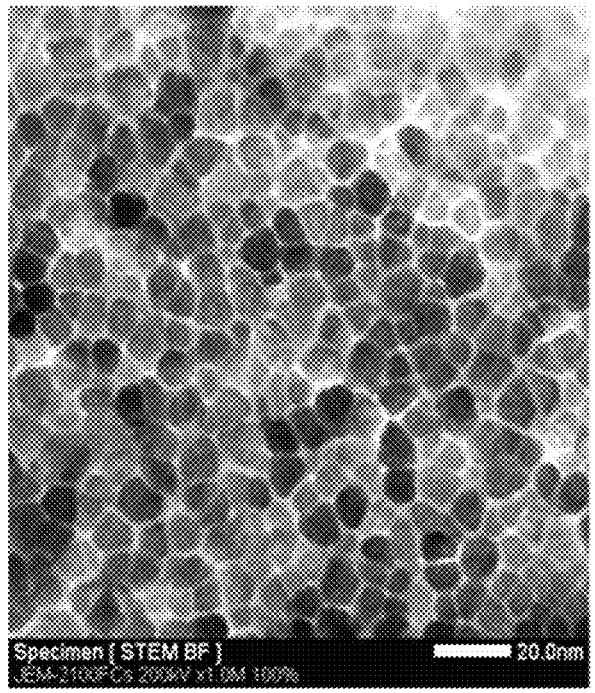
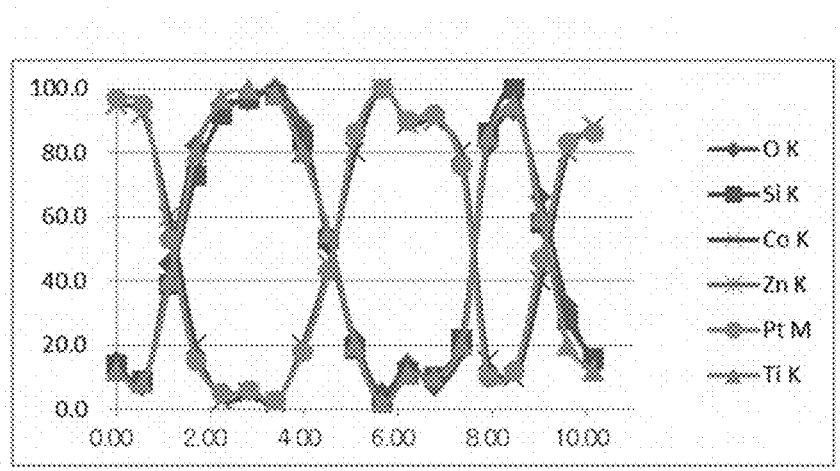

[FIG. 6]
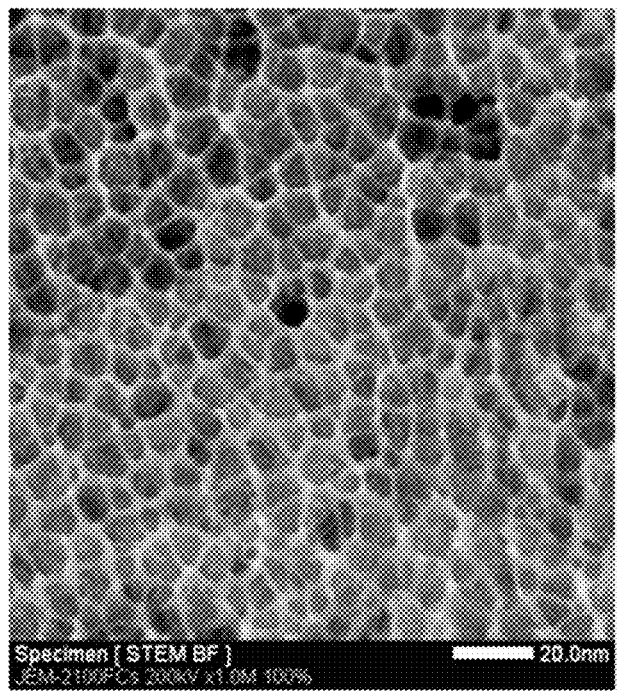
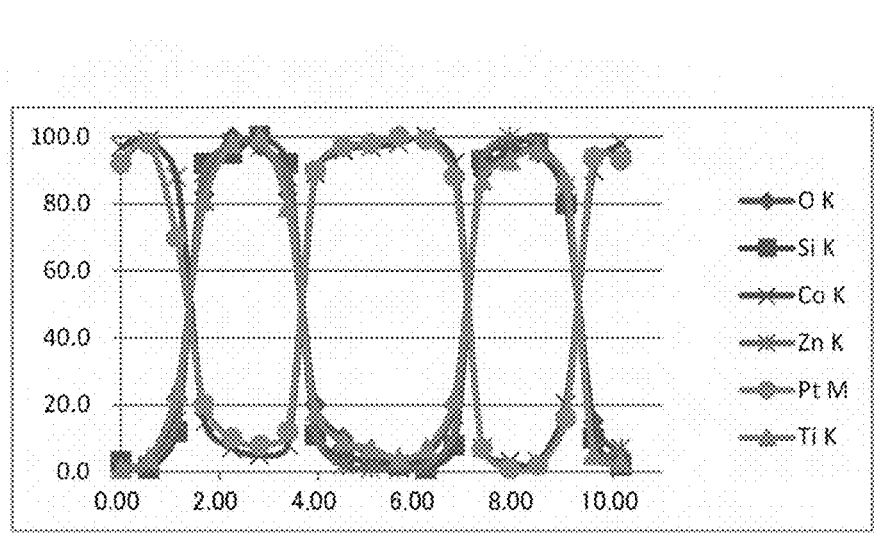

[FIG. 7]
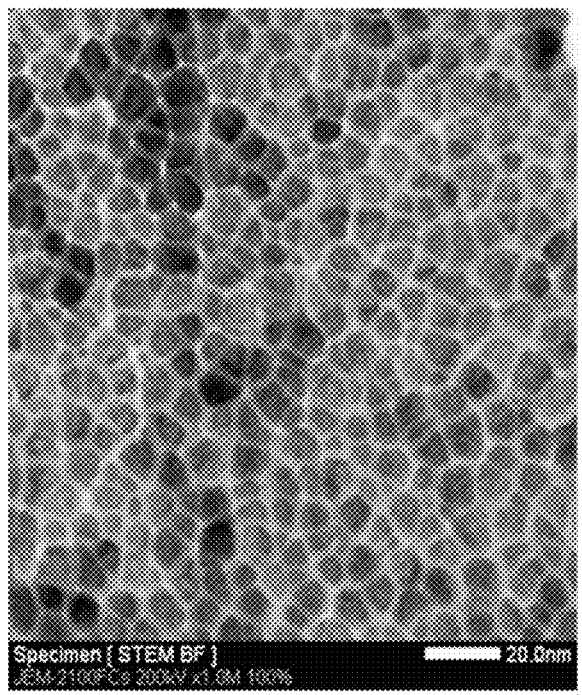
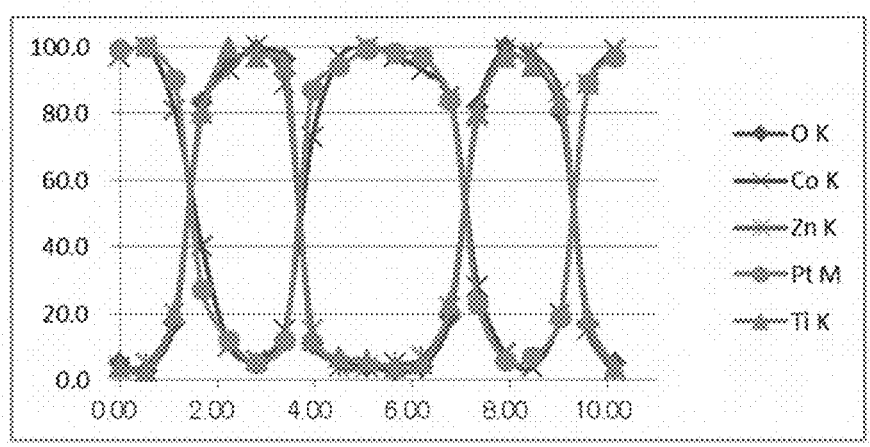

[FIG. 8]
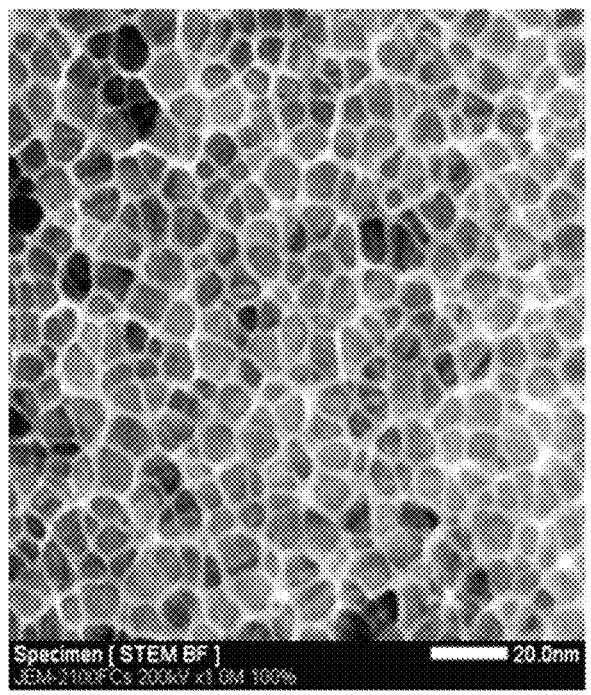
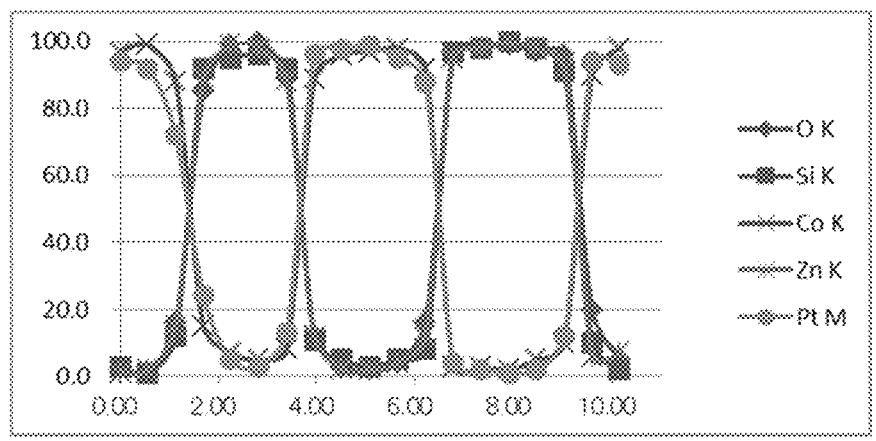

[FIG. 9]
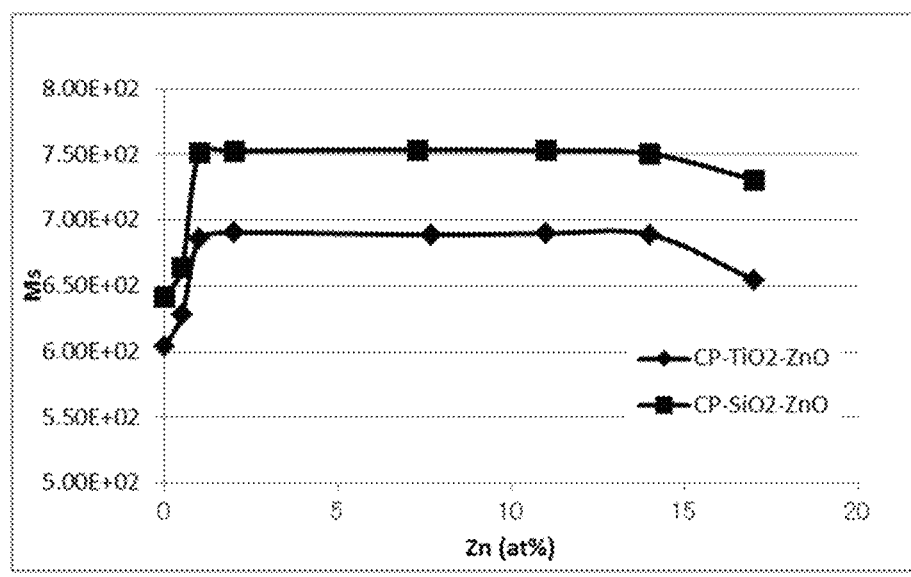

SPUTTERING TARGET, MAGNETIC FILM AND METHOD FOR PRODUCING MAGNETIC FILM

TECHNICAL FIELD

The present invention relates to a sputtering target used for forming magnetic recording layers or other magnetic films that have a structure in which oxide grains are dispersed in a metallic phase mainly composed of Co and that form magnetic recording media; to a magnetic film; and to a method for producing a magnetic film. More particularly, the present invention proposes a technique that can contribute to improvement of magnetic characteristics of magnetic films.

BACKGROUND ART

For example, in a hard disk device, a perpendicular magnetic recording system for recording magnetism in a direction perpendicular to a recording surface has been put to practical use and has been widely adopted because it enables high-density recording as compared with a longitudinal magnetic recording method.

The magnetic recording medium in the perpendicular magnetic recording system generally has a structure in which a soft magnetic layer, a non-magnetic intermediate layer, a magnetic recording layer and a protective layer are sequentially laminated on a substrate such as aluminum or glass. For the magnetic recording layer among the layers, a magnetic film having a granular structure in which an oxide such as $SiO_2$ and the like is added to a Co—Cr—Pt based alloy containing Co as a main component is used. Thus, in the magnetic recording layer, the above oxide that will be a non-magnetic material is deposited at grain boundaries of magnetic grains such as a Co alloy oriented in a perpendicular direction to reduce magnetic interaction between the magnetic grains, thereby improving noise characteristics and achieving high recording density.

Such a magnetic recording layer of a magnetic recording medium is usually formed by sputtering on a predetermined layer by means of a magnetron sputtering apparatus using a sputtering target in which predetermined oxide grains are dispersed in metal phases mainly based on Co.

In addition, prior arts relating to this type of sputtering are described in Patent Documents 1 to 7.

CITATION LIST

Patent Literatures

Patent Document 1: Japanese Patent Application Publication No. 2011-208169 A
Patent Document 2: Japanese Patent Application Publication No. 2011-174174 A
Patent Document 3: Japanese Patent Application Publication No. 2011-175725 A
Patent Document 4: Japanese Patent Application Publication No. 2012-117147 A
Patent Document 5: Japanese Patent No. 4885333 B
Patent Document 6: WO 2012/086388 A1
Patent Document 7: WO 2015/064761 A1

SUMMARY OF INVENTION

Technical Problem

In general, the sputtering target used for forming the magnetic recording layer of the perpendicular magnetic recording system as described above uses a metal oxide such as $SiO_2$ and $TiO_2$, as an oxide for magnetically separating magnetic grains oriented in a vertical direction from each other.

However, it has been found that only addition of such an oxide of Si or Ti has led to insufficient separation between the magnetic grains, thereby causing a problem in terms of reducing noises due to the recording layer.

On the other hand, if an amount of added oxide is to be increased in order to improve the separation, the magnetic grains will become small or oxides will be distributed in the magnetic grains, so that high coercive force cannot be maintained.

An object of this invention is to solve such problems of the prior arts. An object of the present invention is to provide a sputtering target that can form a magnetic film having both good magnetic separation between magnetic grains and high coercive force at the same time; a magnetic film; and a method for producing a magnetic film.

Solution to Problem

The present inventors have found that when producing a sputtering target, metal powder such as Co, as well as oxide powder of Si and/or Ti, and further ZnO powder are added, and these powders are sintered in a vacuum atmosphere or an inert gas atmosphere at a temperature range of from 700 to 1500° C., for example using a hot press method, so that Zn—Ti—O and/or Zn—S—O complex oxides are formed, and the complex oxides lead to good magnetic separation and high coercive force.

While not wishing to be bound by any theory, the present inventers believe that this can allow the Zn—Ti—O and Zn—Si—O complex oxides to be almost uniformly distributed around the magnetic grains, thereby reducing ferromagnetic exchange coupling between the grains without decreasing sizes and magnetic anisotropy of the magnetic grains.

Under such findings, a sputtering target according to the present invention comprises: 1 at. % or more of Zn, a part or all of Zn forming a complex oxide(s) of Zn—Ti—O and/or Zn—Si—O; and 45 at. % or less of Pt, the balance being Co and inevitable impurities, the atomic percentage being based on an atomic ratio.

In the sputtering target according the present invention, the oxide preferably comprises $Zn_2TiO_4$ and/or $Zn_2SiO_4$.

Further, it is preferable that the sputtering target according to the present invention comprises from 1 at. % to 15 at. % of Zn.

In the sputtering target according to the present invention, an oxide of at least one element selected from the group consisting of Co, Cr, Si, B, W, Nb, Mn, Mo and Ti may be further formed.

Further, the sputtering target according to the present invention further comprises 60 at. % or less of at least one selected from the group consisting of Au, Ag, B, Cu, Cr, Ga, Ge, Ir, Mn, Mo, Nb, Ni, Pd, Re, Rh, Ru, Si, Sn, Ti, Ta, W, V and Zn.

A magnetic film according to the present invention comprises: 1 at. % or more of Zn; Ti and/or Zn; and Si, a part or all of the elements being present as an oxide; and 45 at. % or less of Pt, the balance being Co and inevitable impurities.

It is preferable that the magnetic film according to the present invention comprises 1 at. % or more and 15 at. % or less of Zn.

In the magnetic film according to the present invention, an oxide of at least one element selected from the group consisting of Co, Cr, Si, B, W, Nb, Mn, Mo and Ti may be further formed.

Further, the magnetic film according to the present invention further comprises 60 at. % or less of at least one selected from the group consisting of Au, Ag, B, Cu, Cr, Ga, Ge, Ir, Mn, Mo, Nb, Ni, Pd, Re, Rh, Ru, Si, Sn, Ti, Ta, W, V and Zn.

A method for producing a magnetic film according to the present invention comprises forming a magnetic film by sputtering using any one of the sputtering targets as described above.

Advantageous Effects of Invention

According to the present invention, both of good magnetic separation between magnetic grains and high coercive force can be achieved by containing a Zn—Ti—O and/or Zn—Si—O complex oxide. As a result, magnetic characteristics of the magnetic film can be improved.

BRIEF DESCRIPTION OF DRAWINGS

FIG. 1 shows a change in each of magnetization Ms, coercive force Hc, a slope α of a magnetization curve, and magnetic anisotropy Ku relative to a film thickness, for each of magnetic films formed by sputtering targets of Example 1 and Comparative Example 1 in Test Example 1.

FIG. 2 shows a change in each of magnetization Ms, coercive force Hc, a slope α of a magnetization curve, and magnetic anisotropy Ku relative to a film thickness, for each of magnetic films formed by sputtering targets of Example 2 and Comparative Example 2 in Test Example 1.

FIG. 3 shows a change in each of magnetization Ms, coercive force Hc, a slope α of a magnetization curve, and magnetic anisotropy Ku relative to a film thickness, for each of magnetic films formed by sputtering targets of Example 3 and Comparative Example 3 in Test Example 1.

FIG. 4 shows a change in each of magnetization Ms, coercive force Hc, a slope α of a magnetization curve, and magnetic anisotropy Ku relative to a film thickness, for each of magnetic films formed by sputtering targets of Examples 2, 4 and 5 and Comparative Example 2 in Test Example 1.

FIG. 5 is a graph showing EDX mapping results of a magnetic film formed by a sputtering target according to Comparative Example 1 in Test Example 1 and a TEM image.

FIG. 6 is a graph showing EDX mapping results of a magnetic film formed by a sputtering target according to Example 1 in Test Example 1 and a TEM image.

FIG. 7 is a graph showing EDX mapping results of a magnetic film formed by a sputtering target according to Example 1 in Test Example 2 and a TEM image.

FIG. 8 is a graph showing EDX mapping results of a magnetic film formed by a sputtering target according to Example 3 in Test Example 1 and a TEM image.

FIG. 9 is a graph showing a change in magnetization Ms relative to an amount of Zn in Test Example 2.

DESCRIPTION OF THE PREFERRED EMBODIMENTS

Embodiments of the present invention will be described in detail below.

The sputtering target according to one embodiment of the present invention is a sputtering target of a sintered body in which metal phases capable of forming magnetic grains, for example in a magnetic film such as a recording magnetic layer of a perpendicular magnetic recording system, are made of a metal or an alloy containing 45 at. % or less of Pt, the balance being Co, and the sputtering target has a structure in which oxide grains are dispersed that contains 1 at. % or more of Zn, a part or all of which is contained as an oxide in oxide phases and a part or all of which form a Zn—Ti—O and/or Zn—Si—O complex oxide. Because of the presence of such a complex oxide, the complex oxide is uniformly distributed around the magnetic grains oriented in a vertical direction in the magnetic film and serves to allow magnetic and effective separation of the magnetic grains.

(Composition)

Each metal phase is mainly composed of Co, and optionally contains Pt. More particularly, each metal phase is a metal consisting only of Co, or an alloy containing Pt, the balance being Co. When containing Pt, the content of Pt can be 0.1 at. % or more and 45 at. % or less. Further, the metal phase may contain impurities that may be inevitably contaminated (so-called inevitable impurities).

Furthermore, the metal phases further contain at least one selected from the group consisting of Au, Ag, B, Cu, Cr, Ga, Ge, Ir, Mn, Mo, Nb, Ni, Pd, Re, Rh, Ru, Si, Sn, Ti, Ta, W, V And Zn and Zn, for example in an amount of 60 at. % or less, and typically from 0.5 at. % to 60 at. %. The containing of such elements can allow expectation of further improvement of magnetic characteristics for the magnetic film. It should be noted that these elements are mainly contained in the metal phases, but a part of these elements may be contained as an oxide(s) by oxidization of the elements due to sintering during production as described below.

The metal phases as described above form magnetic phases, but a sputtering target for forming a magnetic film such as a magnetic recording layer of a perpendicular magnetic recording system contains oxide phases as non-magnetic phases.

Here, in the present invention, an oxide(s) containing Zn is/are contained as an oxide(s) contained in the oxide phases, and at least a part of the oxide(s) containing Zn is Zn—Ti—O and/or Zn—Si—O complex oxide. Such an oxide forms grain boundaries of oxide phases in the magnetic film so as to surround magnetic grains. This can result in reduced magnetic interaction between magnetic grains, leading to improvement of noise characteristics. In particular, herein, the presence of the Zn—Ti—O or Zn—Si—O complex oxide can allow good magnetic separation between magnetic grains to be achieved.

Zn is contained in an amount of 1 at. % or more, and it is understood that a part or all of Zn is included in the oxide. That is, if the content of Zn is less than 1 at. %, a sufficient amount of Zn—Ti—O and/or Zn—Si—O cannot be formed to separate the magnetic grains. On the other hand, if the content of Zn is too high, Zn may be localized in the magnetic grains. Therefore, the content of Zn is preferably 20 at. % or less. In particular, the content of Zn is more preferably 1 at. % or more and 15 at. % or less. It should be noted that Zn is suitably contained in an amount of from 1 at. % to 15 at. %.

More particularly, for the Zn—Ti—O and/or Zn—Si—O complex oxide, the Zn—Ti—O is $Zn_2TiO_4$, and the Zn—Si—O is $Zn_2SiO_4$. When at least one of $Zn_2TiO_4$ and $Zn_2SiO_4$ is present, a magnetic film having good magnetic characteristics can be formed. This would be because these oxides lower the melting point as compared with $TiO_2$ or $SiO_2$, whereby the oxides are easily rearranged on the substrate during sputtering.

Whether or not $Zn_2TiO_4$ or $Zn_2SiO_4$ is present can be confirmed by observing a peak of diffraction intensity with X-ray diffraction (XRD).

Further, the metal phases may contain an oxide of at least one element selected from the group consisting of Co, Cr, Si, B, W, Nb, Mn, Mo and Ti. In general, the magnetic recording layer of the perpendicular magnetic recording system contains, in addition to the oxides and complex oxides of Zn as described above, at least one of oxides of Co, oxides of Cr, oxides of Si, oxides of B, oxides of W, oxides of Nb, oxides of Mn, oxides of Mo and oxides of Ti. The oxides such as Si also form grain boundaries of oxide phases so as to surround the magnetic grains and provide further improved separation between the magnetic grains. When the oxides of Cr, Si, B, W, Nb, Mn, Mo and Ti are contained in respective atomic ratios of from 0 to 40 at. %, relative to the entire sputtering target, the crystal orientation and magnetism of metallic Co can be stably maintained. In particular, the atomic ratio of from 0.5 at. % to 20 at. % can allow stable DC sputtering.

(Magnetic Film)

A predetermined magnetic film can be formed by forming a film on a substrate with a magnetron sputtering apparatus or the like using the sputtering target as described above.

Such a magnetic film contains Zn and, Ti and/or Si, and contains 45 at. % or less of Pt, balance being Co and inevitable impurities. Among these, some or all of Zn, Ti and Si are present as oxides. That is, the magnetic film contains at least one oxide of Zn; Ti; O and Zn; and Si and O. The content of Zn in the magnetic film is 1 at. % or more, and preferably 1 at. % or more and 15 at. % or less.

As to whether or not the above Zn, Ti, and Si are contained as complex oxides in the magnetic film, it is difficult for general structural analysis using X-rays to confirm how they are complexed because they are distributed in gaps (grain boundaries) between magnetic grains having a width of about 1 nm in a film having only about 10 nm.

Also, the magnetic film can further contain an oxide of at least one element selected from the group consisting of Co, Cr, Si, B, W, Nb, Mn, Mo and Ti.

The magnetic film may further contain at least one selected from the group consisting of Au, Ag, Cr, Cu, Ga, Ge, Ir, Mn, Mo, Nb, Ni, Pd, Re, Rh, Ru, Sn, Ta, W, V and Zn in an amount of 60 at. % or less, and typically 0.5 at. % to 60 at. %.

(Method for Producing Sputtering Target)

The above sputtering target can be produced by a powder sintering method, and specific examples thereof are as follows.

First, as metal powder, at least Co powder, and optionally Pt powder and/or Cr powder, and optionally metal powder such as Au powder, Ag powder, B powder and Cu powder, are prepared. The metal powder may be powder of not only a single element but also an alloy. The particle diameter of the metal power is preferably in a range of from 1 µm to 10 µm, in terms of enabling homogeneous mixing to prevent segregation and coarse crystallization. When the particle diameter of the metal powder is more than 10 µm, the oxide grains may not be uniformly dispersed, and when it is less than 1 µm, the sputtering target may deviate from the desired composition due to the oxidation of the metal powder.

Further, as the oxide powder, ZnO powder, $SiO_2$ powder and/or $TiO_2$ powder, and optionally $Co_3O_4$, $B_2O_3$ or the like are prepared. The oxide powder has a particle diameter in a range of from 1 µm to 30 µm. This can lead to more uniform dispersion of the oxide grains in the metal phase when the oxide powder is mixed with the metal powder, and fired under pressure. If the particle diameter of the oxide powder is more than 30 µm, coarse oxide grains may be formed after firing under pressure. On the other hand, if it is less than 1 µm, agglomeration of the oxide powders may occur.

The raw material powder comprised of the above metal powder and oxide powder is weighed so as to provide a desired composition, and mixed and pulverized using a known technique such as a ball mill. In this case, it is desirable to fill the inside of a container used for the mixing/pulverizing with an inert gas to suppress the oxidation of the raw material powder as much as possible. This can provide mixed powder in which predetermined metal powder and oxide powder are uniformly mixed.

The mixed powder thus obtained is then sintered under pressure in a vacuum atmosphere or an inert gas atmosphere, and formed into a predetermined shape such as a disk shape. Herein, various pressure sintering methods can be employed such as a hot press sintering method, a hot hydrostatic sintering method, a plasma discharge sintering method and the like. Among them, the hot hydrostatic sintering method is effective in terms of improvement of density of a sintered body.

A retention temperature during the sintering is in a temperature range of from 700 to 1500° C., and particularly preferably from 800° C. to 1400° C. A time for maintaining the temperature in this range is preferably 1 hour or more.

A pressing pressure during the sintering is preferably from 10 MPa to 40 MPa, and more preferably from 25 MPa to 35 MPa.

This can allow the oxide grains to be more uniformly dispersed in the metal phase.

The sintered body obtained by the pressure sintering can be subjected to cutting into a desired shape using a lathe or the like or other mechanical processing to produce a sputtering target.

(Method for Producing Magnetic Film)

The sputtering target produced as described above can be used for production of the above magnetic film. More particularly, using such a sputtering target, sputtering is carried out in general with a magnetron sputtering apparatus to form a film on a predetermined substrate or another film, so that a magnetic film can be formed thereon.

EXAMPLES

Next, the sputtering target according to present invention was experimentally conducted and effects exerted by a magnetic layer formed by the sputtering target were confirmed as described below. However, the description herein is merely for the purpose of illustration and is not intended to be limited thereto.

Test Example 1

Co powder, Pt powder, $TiO_2$ powder, $SiO_2$ powder and ZnO powder were weighed such that a composition ratio was 64:22:5:3:6 in a molecular number ratio, and the powders were sealed in a 10 liter ball mill pot together with the zirconia balls as grinding media, and mixed by rotating them for 24 hours. The mixed powder taken out of the ball mill was filled in a carbon mold having a diameter of 190 mm, and sintered by a hot press. The hot press was carried out in a vacuum atmosphere at a temperature rising rate of 300° C./hour and at a retention temperature of 950° C. for a retention time of 2 hours, and by applying a pressure of 30 MPa from initiation of the temperature rising to the end of temperature retention. After the temperature retention was completed, the resulting compact was naturally cooled as it was in a chamber. The sintered body thus obtained was cut with a lathe so as to have a disk shape having a diameter of 180.0 mm and a thickness of 5.0 mm, to produce a sputtering target of Example 1.

A sputtering target of Example 2 was produced by the same method as that of Example 1, with the exception that as raw material powder, Co powder, Pt powder, $TiO_2$ powder and ZnO powder were used, and the composition ratio was 63:21:7:9.

A sputtering target of Example 3 was produced by the same method as that of Example 1, with the exception that as raw material powder, Co powder, Pt powder, $SiO_2$ powder and ZnO powder were used, and the composition ratio was 64:22:5:9.

A sputtering target of Example 4 was produced by the same method as that of Example 1, with the exception that as raw material powder, Co powder, Pt powder, $TiO_2$ powder, ZnO powder and $Co_3O_4$ powder were used, and the composition ratio was 65:22:5:6:2.

A sputtering target of Example 5 was produced by the same method as that of Example 1, with the exception that as raw material powder, Co powder, Pt powder, $TiO_2$ powder, ZnO powder and $B_2O_3$ powder were used, and the composition ratio was 65:22:5:6:2.

A sputtering target of Comparative Example 1 was produced by the same method as that of Example 1, with the exception that as raw material powder, Co powder, Pt powder, $TiO_2$ powder and $SiO_2$ powder were used, and the composition ratio was 64:22:7:5.

A sputtering target of Comparative Example 2 was produced by the same method as that of Example 1, with the exception that as raw material powder, Co powder, Pt powder and $TiO_2$ powder were used, and the composition ratio was 64:22:14.

A sputtering target of Comparative Example 3 was produced by the same method as that of Example 1, with the exception that as raw material powder, Co powder, Pt powder and $SiO_2$ powder were used, and the composition ratio was 67:23:10.

For each of the sputtering targets of Examples 1 to 5 as described above, an X-ray diffraction intensity of each target surface was measured using Smartlab available from Rigaku Corporation. Measurement condition at this time was $2\theta=10$-$90°$ in $\theta$-$2\theta$ measurement. Thus, it was found that in the sputtering target of Example 1, Zn was present as $Zn_2TiO_4$ and $Zn_2SiO_4$, and in the sputtering targets of Examples 2, 4 and 5, Zn was present as $Zn_2TiO_4$, and in the sputtering target of Example 3, Zn was present as $Zn_2SiO_4$.

In the sputtering targets of Comparative Examples 1 to 3, it is clear that the oxide of Zn is not formed because ZnO is not added.

Further, each of the sputtering targets of Examples 1 to 5 and Comparative Examples 1 to 3 was set in a magnetron sputtering apparatus (C-3010 sputtering system from CANON ANELVA CORPORATION), and Ta (2.8 nm), Ni—W (5 nm) and Ru (16 nm) were deposited in this order onto a glass substrate, and sputtering was carried out at 300 W in an Ar atmosphere of 5.0 Pa to form magnetic films each having a film thickness of 7 nm, 11 nm, 14 nm, and 18 nm. Each magnetic film having each film thickness was measured for coercive force Hc, magnetic anisotropy Ku, magnetization Ms, and a slope α of a magnetization curve to obtain results shown in graphs of FIGS. 1 to 5.

Here, the coercive force Hc, the magnetization Ms, and the slope α of the magnetization curve were measured by a sample vibration type magnetometer (VSM) from Tamagawa CO., LTD., and the magnetic anisotropy Ku was measured by a magnetic torque meter (TRQ) from Tamagawa CO., LTD.

It is understood from FIG. 1 that the coercive force Hc is increased and the slope α of the magnetization curve is decreased by adding ZnO to $TiO_2$—$SiO_2$. Further, it is understood from FIGS. 2 and 3 that the magnetization Ms and the magnetic anisotropy Ku are increased and the slope α of the magnetization curve is decreased by adding ZnO to each of $TiO_2$ and $SiO_2$. Therefore, according to Examples 1 to 3, it is clear that the addition of ZnO improves the separation of the magnetic grains. It is also clear that the addition of Zn to $TiO_2$ and $SiO_2$ improves the magnetic characteristics of the magnetic grains.

It is understood from FIG. 4 that even in Examples 4 and 5 containing $Co_3O_4$ and $B_2O_3$, the addition effect of ZnO is obtained to the same extent as in Example 2 which does contain these oxides.

Further, as described above, for each of the magnetic films formed using the sputtering targets of Comparative Example 1 and Examples 1 to 3, a sample was scraped off from a glass substrate side by Ar ion milling such that only the magnetic film was left. The magnetic film was then subjected to line scanning by energy dispersive X-ray spectroscopy (EDX) using a transmission electron microscope (TEM) from JEOL. The results are shown in FIGS. 5 to 8. It should be noted that each of FIGS. 5 to 8 is a graph in which a vertical axis is relative intensity and a horizontal axis is distance (nm). FIG. 5 corresponds to results of Comparative Example 1, FIG. 6 corresponds to results of Example 1, FIG. 7 corresponds to results of Example 2, and FIG. 8 corresponds to results of Example 3.

It is understood from the results shown in FIGS. 5 to 8 that in Examples 1 to 3 in which ZnO was added shows the shaper rising of the graph of the element distribution than that of Comparative Example 1, so that the boundary between the oxide phase and the magnetic grain phase was clear, and Examples 1 to 3 thus had improved separation between the magnetic grains by the oxides.

Test Example 2

For each of sputtering targets produced using Co powder, Pt powder, $TiO_2$ powder and ZnO powder, and sputtering targets produced using Co powder, Pt powder, $SiO_2$ powder and ZnO powder, a plurality of samples in which the amount of ZnO was changed were produced. The production conditions are substantially the same as those described in Test Example 1 as described above.

Each magnetic film was formed by the same method as that of Test Example 1 using each of these samples, and the magnetization Ms of each magnetic film was measured. The results are shown in FIG. 9.

As shown in FIG. 9, the magnetization Ms is rapidly increased at a relatively small amount of Zn, and slightly decreased at an amount of Zn of more than 15 at. %. Therefore, in terms of increasing the magnetization Ms, the Zn content can be preferably from 1 to 15 at. %.

The compositions of the sputtering targets of Examples 1 to 5 and Comparative Examples 1 to 3 as described above and the sputtering targets shown in FIG. 9 are shown in Table 1 for reference.

The sputtering targets of Examples 6 to 10 were also produced. Table 1 also shows the composition of each of the sputtering targets in Examples 6 to 10 for reference.

TABLE 1

|  | Types | Co at % | Pt at % | Ti at % | Si at % | Zn at % | B at % | O at % |
| --- | --- | --- | --- | --- | --- | --- | --- | --- |
| Example 1 | Co—Pt—TiO2—SiO2—ZnO | 52.5 | 18.0 | 4.1 | 2.5 | 4.9 | 0.0 | 18.0 |
| Example 2 | Co—Pt—TiO2—ZnO | 51.2 | 17.1 | 5.7 | 0.0 | 7.3 | 0.0 | 18.7 |
| Example 3 | Co—Pt—SiO2—ZnO | 53.8 | 18.5 | 0.0 | 4.2 | 7.6 | 0.0 | 16.0 |
| Example 4 | Co—Pt—TiO2—ZnO—Co3O4 | 55.5 | 17.2 | 3.9 | 0.0 | 4.7 | 0.0 | 18.8 |
| Example 5 | Co—Pt—TiO2—ZnO—B2O3 | 52.4 | 17.7 | 4.0 | 0.0 | 4.8 | 3.2 | 17.7 |
| Comparative Example 1 | Co—Pt—TiO2—SiO2 | 53.2 | 17.7 | 5.6 | 4.0 | 0.0 | 0.0 | 19.4 |
| Comparative Example 2 | Co—Pt—TiO2 | 50.0 | 17.2 | 10.9 | 0.0 | 0.0 | 0.0 | 21.9 |
| Comparative Example 3 | Co—Pt—SiO2 | 55.8 | 19.2 | 0.0 | 8.3 | 0.0 | 0.0 | 16.7 |
| FIG. 9 | Co—Pt—TiO2 | 50.4 | 16.8 | 10.9 | 0.0 | 0.0 | 0.0 | 21.9 |
| FIG. 9 | Co—Pt—TiO2—ZnO | 50.1 | 16.7 | 10.8 | 0.0 | 0.5 | 0.0 | 21.9 |
| FIG. 9 | Co—Pt—TiO2—ZnO | 50.1 | 16.7 | 10.5 | 0.0 | 1.0 | 0.0 | 21.8 |
| FIG. 9 | Co—Pt—TiO2—ZnO | 50.0 | 16.7 | 9.9 | 0.0 | 2.0 | 0.0 | 21.4 |
| FIG. 9 | Co—Pt—TiO2—ZnO | 50.0 | 16.7 | 6.5 | 0.0 | 7.7 | 0.0 | 19.1 |
| FIG. 9 | Co—Pt—TiO2—ZnO | 50.2 | 16.7 | 4.4 | 0.0 | 11.0 | 0.0 | 17.7 |
| FIG. 9 | Co—Pt—TiO2—ZnO | 50.3 | 16.8 | 2.4 | 0.0 | 14.0 | 0.0 | 16.5 |
| FIG. 9 | Co—Pt—TiO2—ZnO | 50.5 | 16.8 | 0.4 | 0.0 | 17.0 | 0.0 | 15.2 |
| FIG. 9 | Co—Pt—SiO2 | 55.9 | 18.6 | 0.0 | 8.5 | 0.0 | 0.0 | 16.9 |
| FIG. 9 | Co—Pt—SiO2—ZnO | 55.8 | 18.6 | 0.0 | 8.2 | 0.5 | 0.0 | 16.9 |
| FIG. 9 | Co—Pt—SiO2—ZnO | 55.7 | 18.6 | 0.0 | 8.0 | 1.0 | 0.0 | 16.8 |
| FIG. 9 | Co—Pt—SiO2—ZnO | 55.3 | 18.4 | 0.0 | 7.5 | 2.0 | 0.0 | 16.7 |
| FIG. 9 | Co—Pt—SiO2—ZnO | 53.6 | 17.9 | 0.0 | 5.0 | 7.3 | 0.0 | 16.2 |
| FIG. 9 | Co—Pt—SiO2—ZnO | 52.6 | 17.5 | 0.0 | 3.2 | 11.0 | 0.0 | 15.7 |
| FIG. 9 | Co—Pt—SiO2—ZnO | 51.6 | 17.2 | 0.0 | 1.8 | 14.0 | 0.0 | 15.4 |
| FIG. 9 | Co—Pt—SiO2—ZnO | 50.7 | 16.9 | 0.0 | 0.3 | 17.0 | 0.0 | 15.1 |
| Example 6 | Co—Pt—TiO—ZnO | 41.7 | 18.6 | 18.8 | 0.0 | 1.0 | 0.0 | 19.8 |
| Example 7 | Co—Pt—TiO—ZnO | 36.9 | 16.4 | 22.2 | 0.0 | 1.2 | 0.0 | 23.4 |
| Example 8 | Co—Pt—TiO—ZnO | 22.2 | 9.9 | 33.0 | 0.0 | 1.0 | 0.0 | 34.0 |
| Example 9 | Co—Pt—TiO—ZnO | 16.5 | 7.3 | 37.1 | 0.0 | 1.0 | 0.0 | 38.1 |
| Example 10 | Co—Pt—TiO—ZnO | 11.7 | 5.2 | 40.5 | 0.0 | 1.0 | 0.0 | 41.5 |

In view of the foregoing, it is found that according to the present invention, it is possible to form a magnetic film having improved magnetic characteristics while achieving both good magnetic separation between magnetic particles and high coercive force.

What is claimed is:

1. A sputtering target comprising: 1 at. % or more and 20 at. % or less of Zn, a part or all of Zn forming a complex oxide(s) of Zn—Ti—O and/or Zn—Si—O; and 45 at. % or less of Pt, the balance being Co and inevitable impurities, the atomic percentage being based on an atomic ratio.

2. The sputtering target according to claim 1, wherein the oxide comprises $Zn_2TiO_4$ and/or $Zn_2SiO_4$.

3. The sputtering target according to claim 1, wherein the sputtering target comprises from 1 at. % to 15 at. % of Zn.

4. The sputtering target according to claim 1, wherein an oxide of at least one element selected from the group consisting of Co, Cr, Si, B, W, Nb, Mn, Mo, and Ti is further formed.

5. The sputtering target according to claim 1, wherein the sputtering target further comprises 60 at. % or less of at least one selected from the group consisting of Au, Ag, B, Cu, Cr, Ga, Ge, Ir, Mn, Mo, Nb, Ni, Pd, Re, Rh, Ru, Si, Sn, Ti, Ta, W, V, and Zn.

6. A magnetic film, comprising: 1 at. % or more and 20 at. % or less of Zn; Ti and/or Si; a part or all of the Zn, Ti, and/or Si being present as an oxide; and 45 at. % or less of Pt, the balance being Co and inevitable impurities, wherein the magnetic film contains an oxide of Zn, Ti, and O, and/or an oxide of Zn, Si, and O.

7. The magnetic film according to claim 6, wherein the magnetic film comprises 1 at. % or more and 15 at. % or less of Zn.

8. The magnetic film according to claim 6, wherein an oxide of at least one element selected from the group consisting of Co, Cr, Si, B, W, Nb, Mn, Mo, and Ti is further formed.

9. The magnetic film according to claim 6, wherein the magnetic film further comprises 60 at. % or less of at least one selected from the group consisting of Au, Ag, B, Cu, Cr, Ga, Ge, Ir, Mn, Mo, Nb, Ni, Pd, Re, Rh, Ru, Si, Sn, Ti, Ta, W, V, and Zn.

10. A method for producing a magnetic film, comprising forming a magnetic film by sputtering using the sputtering target according to claim 1.

* * * * *